United States Patent
Hsieh

(10) Patent No.: US 8,907,415 B2
(45) Date of Patent: Dec. 9, 2014

(54) HIGH SWITCHING TRENCH MOSFET

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 867 days.

(21) Appl. No.: 13/108,066

(22) Filed: May 16, 2011

(65) Prior Publication Data

US 2012/0292694 A1 Nov. 22, 2012

(51) Int. Cl.

| | | |
|---|---|---|
| *H01L 29/78* | (2006.01) | |
| *H01L 29/40* | (2006.01) | |
| *H01L 29/66* | (2006.01) | |
| *H01L 29/08* | (2006.01) | |
| *H01L 29/10* | (2006.01) | |
| *H01L 29/417* | (2006.01) | |
| *H01L 29/423* | (2006.01) | |
| *H01L 29/45* | (2006.01) | |

(52) U.S. Cl.
CPC .......... *H01L 29/7813* (2013.01); *H01L 29/407* (2013.01); *H01L 29/66727* (2013.01); *H01L 29/66734* (2013.01); *H01L 29/7811* (2013.01); *H01L 29/0865* (2013.01); *H01L 29/1095* (2013.01); *H01L 29/41741* (2013.01); *H01L 29/41766* (2013.01); *H01L 29/4236* (2013.01); *H01L 29/4238* (2013.01); *H01L 29/456* (2013.01)
USPC ............................ 257/331; 257/301; 257/334

(58) Field of Classification Search
CPC ...................................................... H01L 29/78
USPC ......................................... 257/327–349, 301
See application file for complete search history.

(56) References Cited

U.S. PATENT DOCUMENTS 8,274,113 B1 * 9/2012 Hsieh ............................ 257/334

* cited by examiner

*Primary Examiner* — Tran Tran
(74) *Attorney, Agent, or Firm* — Bacon & Thomas, PLLC

(57) ABSTRACT

A shielded gate trench metal oxide semiconductor filed effect transistor (MOSFET) having high switching speed is disclosed. The inventive shielded gate trench MOSFET includes a shielded electrode spreading resistance placed between a shielded gate electrode and a source metal to enhance the performance of the shielded gate trench MOSFET by adjusting doping concentration of poly-silicon in gate trenches to a target value. Furthermore, high cell density is achieved by employing the inventive shielded gate trench MOSFET without requirement of additional cost.

21 Claims, 17 Drawing Sheets

HIGH SWITCHING TRENCH MOSFET

FIELD OF THE INVENTION

This invention relates in general to semiconductor devices, and more particularly, to an improved and novel device configuration for providing a metal oxide semiconductor field effect transistor (MOSFET) with high switching speed.

BACKGROUND OF THE INVENTION

Compared to a conventional trench metal oxide semiconductor field effect transistor (hereinafter MOSFET), a shielded gate trench MOSFET is more attractive due to its reduced Cgd (capacitance between gate and drain) in accordance with reduced Qgd (charge between gate and drain), and increased breakdown voltage of the trench MOSFET, making an excellent choice for power switching applications such as inverter and DC to DC power supply circuits. However, for those power switching applications, MOSFET body diode reverse recovery charge is very important due to the fact that high body diode reverse recovery charge value increase complimentary MOSFET turn-on loss, which pronounces especially when the shielded gate trench MOSFET is used for the low-side switch.

FIG. 1A shows a shielded gate trench MOSFET 100 disclosed in prior art U.S. Pat. No. 7,768,064 comprising a resistive element 101 between shielded electrode 102 and source metal for reduction of the reverse recovery charge of a parasitic body diode in the shielded gate trench MOSFET 100. Besides, the shielded gate trench MOSFET 100 further comprises: a planar source-body contact to contact n+ source region 103 and P body region 104 with the source metal 105; and a p+ ohmic body contact doped region 106 to reduce the contact resistance between the source metal 105 and the P body region 104.

From FIG. 1B which is a top view of the shielded gate trench MOSFET 100, it can be seen that, the resistive element 101 (illustrated by dash lines) is placed between end contacts 106 and 107, wherein the end contact 106 is connected to the shielded electrode 102 (as shown in FIG. 1A) while the end contact 107 is connected to the source metal 105. However, according to the prior art, the resistive element 101 is implemented by poly-silicon, diffusion or other suitable material as long as the resistive element 101 is greater than overall distribution or spreading resistance of the shielded electrode 102, therefore, the implementation of the resistive element 101 will need additional cost such as additional mask for poly-silicon resistor. Moreover, if the resistive element 101 is made of diffusion such as n+ source, an additional parasitic bipolar will be introduced degrading in the breakdown voltage.

Furthermore, the shielded gate trench MOSFET 100 used planar source-body contacts as shown in FIG. 1A, resulting in difficulty for cell pitch shrinkage.

Accordingly, it would be desirable to provide a new and improved power semiconductor device, for example a shielded gate trench MOSFET having high switching speed and high cell density without requirement of additional cost.

SUMMARY OF THE INVENTION

It is therefore an aspect of the present invention to provide a new and improved power semiconductor device to solve the problems discussed above. According to the present invention, there is provided a power semiconductor device comprising: a plurality of gate trenches extending into a silicon layer of a first conductivity type; a gate electrode disposed in upper portion of each of the gate trenches and a shielded electrode disposed in lower portion of each of the gate trenches, wherein the gate electrode and the shielded electrode insulated from each other by an inter-electrode insulating layer; the gate electrode and the shielded electrode are doped poly-silicon layers wherein the gate electrode having doping concentration equal to or higher than the shielded electrode; the gate electrode connected to a gate metal through a gate electrode spreading resistance and the shielded electrode connected to a source metal through a shielded electrode spreading resistance; and the upper portion of the gate trenches surrounded by source regions of the first conductivity type and body regions of a second conductivity type in active area.

By providing a power semiconductor device, for example a shielded gate trench MOSFET according to the present invention, the shielded electrode spreading resistance replaces the resistive element in the prior art by adjusting doping concentration of the poly-silicon in the gate trenches to a target value. Therefore, no additional cost will be added and no any drawback is introduced, enhancing the performance of the shielded gate trench MOSFET.

In another preferred embodiment, the power semiconductor device according to the present invention further includes one or more detail features as below: the gate electrode spreading resistance is lower than the shielded electrode spreading resistance; the power semiconductor device further comprising a first gate oxide along sidewalls of the gate electrode and a second gate oxide surrounding bottom and sidewalls of the shielded electrode in each of the gate trenches, wherein the second gate oxide having oxide thickness thicker than the first gate oxide; the power semiconductor device further comprising a plurality of source-body contact trenches formed between two adjacent of the gate trenches and penetrating through a contact insulating layer and the source regions and extending into the body regions; the power semiconductor device further comprising a plurality of source-body contact trenches formed between two adjacent of the gate trenches and penetrating through a contact insulating layer, the source regions and the body regions and extending into the silicon layer; the power semiconductor device further comprising a tungsten layer padded by a barrier layer filled into each the source-body contact trench for contacting the source regions and the body regions along sidewalls of the source-body contact trenches, and the tungsten layer electrically connected to the source metal; the power semiconductor device further comprising an anti-punch through region of the second conductivity type surrounding sidewall and bottom of each the source-body contact trench below the source region; the tungsten layer is only filled within each the source-body contact trench but not extended over top surface of the contact insulating layer; the tungsten layer is not only filled within each the source-body contact trench but also extended over top surface of the contact insulating layer; the gate electrodes extended to a gate electrode contact area in which the gate trenches having a greater trench width than those in the active area as wider gate electrode for electrically connecting to the gate metal, and the source regions not disposed in the gate electrode contact area, and the gate electrode spreading resistance built in between each the gate electrode and the gate metal through the gate electrode contact area; the shielded electrodes extended to a shielded electrode contact area in which the gate trenches having a greater trench width than those in the active area as wider shielded electrodes for electrically connecting to the source metal, and the source regions not disposed in the shielded electrode contact area, and the shielded electrode spreading resistance built in between each the shielded electrodes and the source metal through the source electrode contact area; the power semiconductor device further comprising a termination area having multiple trenched floating gates with floating voltage, penetrating through the body region and extending into the silicon layer, wherein the termination area does not have source regions; the power semiconductor device further comprising a breakdown enhancement doped region below the body region and above bottom of each the trenched floating gate; each of the trenched floating gates comprising a single doped poly-silicon layer with doping concentration same as the shielded electrodes; each of the trenched floating gates comprising an upper and a lower doped poly-silicon layers insulated from each other by an inter-insulating layer.

This invention further disclosed a method of manufacturing a shielded gate trench MOSFET comprising the steps of opening a plurality of gate trenches in a silicon layer; forming a sacrificial oxide onto inner surface of the gate trenches and top surface of the silicon layer; depositing a first doped poly-silicon onto the sacrificial layer and etching it to keep the first poly-silicon within lower portion of the gate trenches in active area and gate electrode contact area, while leaving the first doped poly-silicon fully filling into the gate trench in shielded electrode contact area defined by a poly mask; etching back and removing the sacrificial oxide from the top surface of the silicon layer not covered by the poly mask and from upper sidewalls of the gate trenches in the active area and the gate electrode contact area, making top surface of the sacrificial oxide lower than top surface of the shielded electrodes in the active area and the gate electrode contact area; removing away the poly mask; forming a gate oxide covering upper sidewalls of the gate trenches in the active area and the gate electrode contact area and overlying top surface of the silicon layer; forming a second doped poly-silicon layer filling in upper portion of the gate trenches in the active area and the gate electrode contact area, wherein the second doped poly-silicon having doping concentration equal to or higher than the first doped poly-silicon; carrying out ion implantation to form body regions in upper portion of the silicon layer and extending between every two adjacent of the gate trenches; carrying out ion implantation to form source regions in upper portion of the body region only in the active area.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE EMBODIMENTS

Figure 1A:
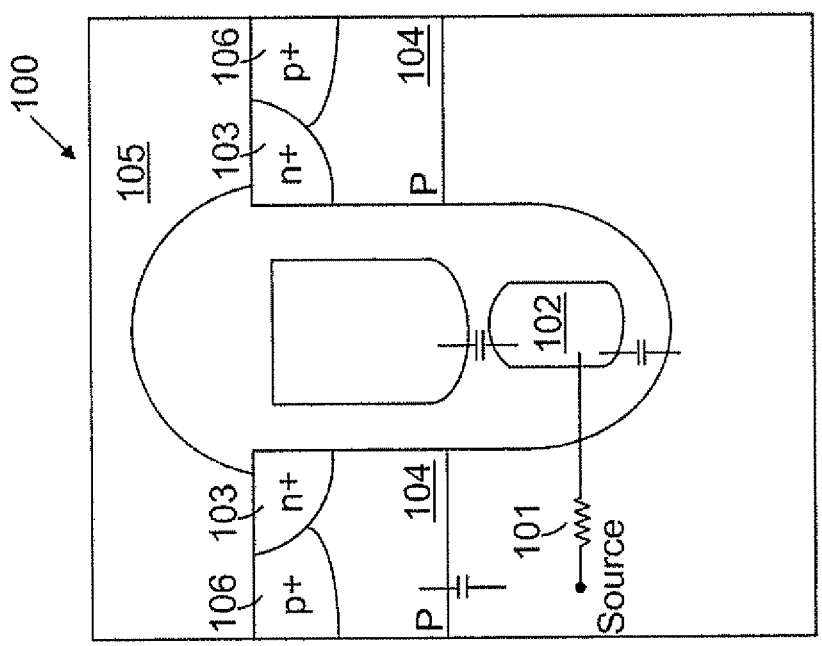
FIG. 1A is a cross-sectional view showing a shielded gate trench MOSFET of prior art.
Figure 1B:
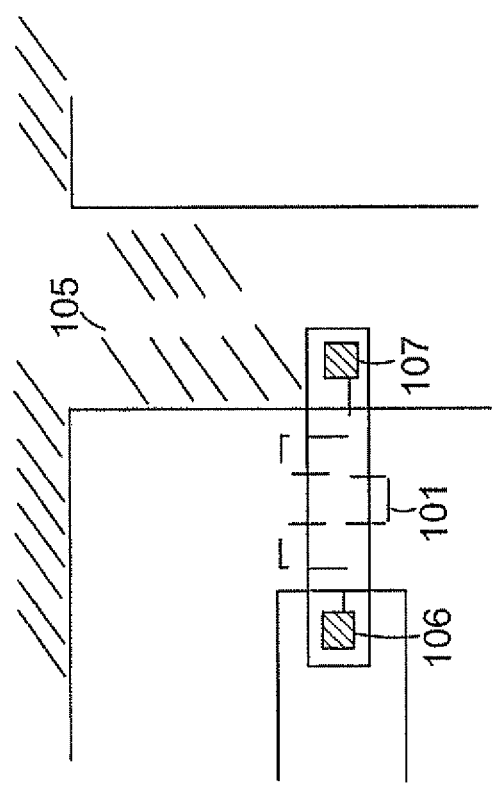
FIG. 1B is a top view showing the shielded gate trench MOSFET in FIG. 1A.
Figure 2:
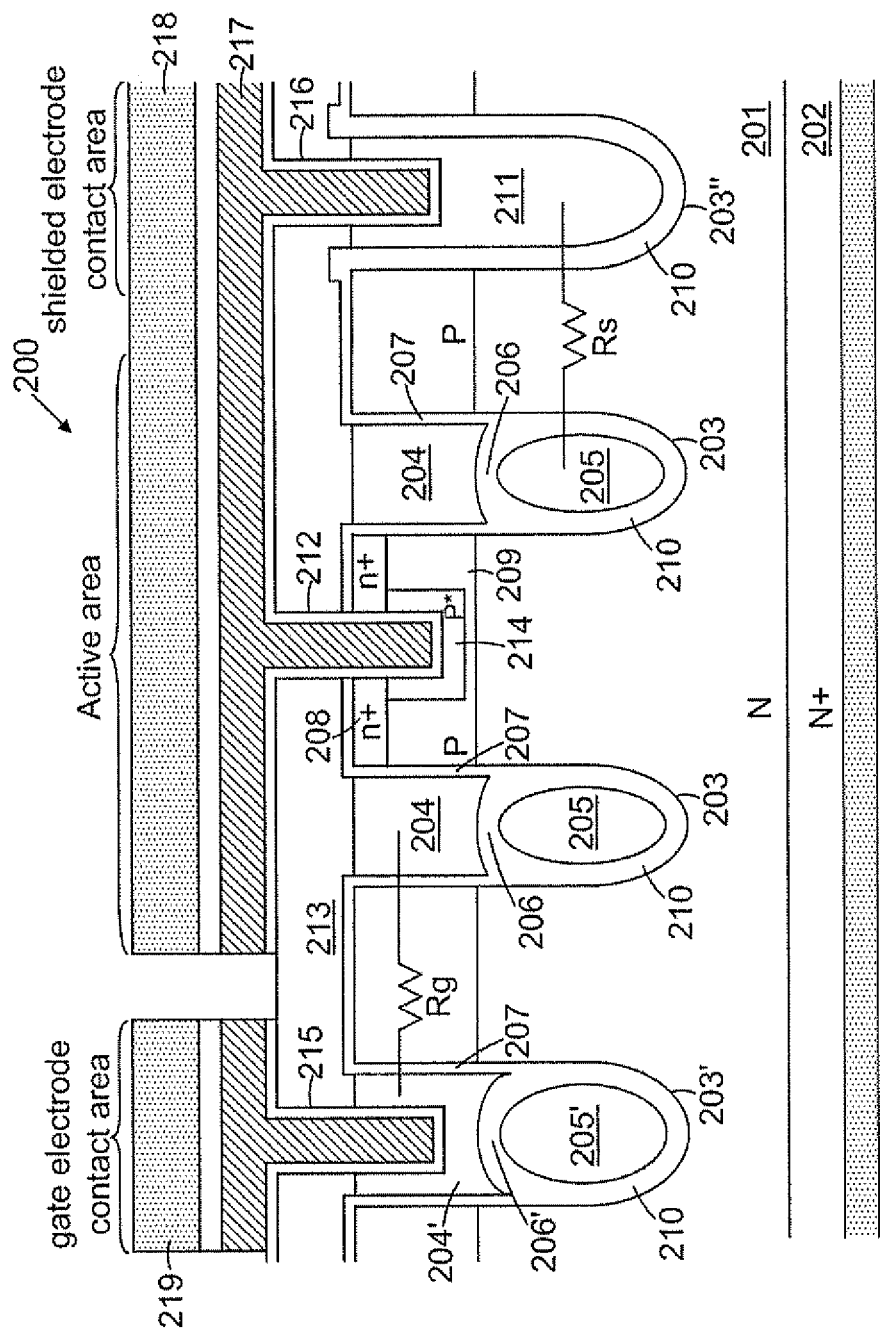
FIG. 2 is a cross-sectional view showing a preferred embodiment of the present invention.

FIG. 2 is a cross-sectional view showing a shielded gate trench MOSFET 200 according to a preferred embodiment of the present invention. The shielded gate trench MOSFET 200 is formed in a silicon layer, for example an epitaxial layer 201 of a first conductivity type, here n-type, grown on top surface of an N+ semiconductor substrate 202 having same conductivity type with the N epitaxial layer 201 and padded by a back metal on rear side as drain metal 220. A plurality of gate trenches 203 in active area, at least one gate trench 203' and 203" in gate electrode contact area, and at least one gate trench 203" in shielded electrode contact area are extending from top surface of the N epitaxial layer 201 to a certain depth. Among those gate trenches, the gate trench 203' in the gate electrode contact area and the gate trench 203" in the shielded electrode contact area each has greater trench width than the gate trenches 203 in the active area for wider electrode contact. The gate trenches 203 in the active area each comprises a gate electrode 204 in upper portion and a shielded electrode 205 in lower portion, wherein the gate electrode 204 and the shielded electrode 205 is insulated from each other by an inter-electrode insulating layer 206. Along upper sidewalls of each the gate trench 203, a first gate oxide 207 is formed adjacent to the gate electrode 204 to insulate the gate electrode 204 from n+ source regions 208 and P body regions 209 surrounding upper portion of the gate trench 203, wherein the P body regions are extending between two adjacent of the gate trenches 203 and the n+ source regions 208 are formed near top surface of the P body regions 209. Along bottom and lower sidewalls of each the gate trench 203, a second gate oxide 210 is formed adjacent to the shielded electrode 205 to insulate the shielded electrode 205 from the N epitaxial layer 201. The gate trench 203' in the gate electrode contact area comprises a gate electrode 204' in upper portion and a shielded electrode 205' in lower portion, wherein the shielded electrode 205' is insulated from the gate electrode 204' by an inter-electrode insulating layer 206', wherein the gate electrode 204' is insulated from the adjacent P body regions 209 by the first gate oxide 207 while the shielded electrode 205' is insulated from the adjacent N epitaxial layer 201 by the second gate oxide 210. The gate trench 203" in the shielded electrode contact area comprises a source electrode 211 which is insulated from the adjacent P body regions 208 and the N epitaxial layer 201 by the second gate oxide 210. Within the gate electrode contact area and the shielded electrode contact area, there is no n+ source regions but only P body regions 209 extending in upper portion of the N epitaxial layer 201. Between every two adjacent of the gate trenches 203 in the active area, a source-body contact trench 212 is formed penetrating through a contact insulating layer 213, the n+ source regions 208 and extending into the P body regions 208, and a P* anti-punch through region 214 is formed within the P body regions 209 and surrounding bottom and sidewalls of the source-body contact trench 212 below the n+ source regions 208. In the gate electrode contact area, a gate electrode contact trench 215 is formed penetrating through the contact insulating layer 213 and extending into the gate electrode 204' in the gate trench 203'. In the shielded electrode contact area, a source electrode contact trench 216 is formed penetrating through the contact insulating layer 213 and extending into the source electrode 211 in the gate trench 203". A tungsten layer 217 padded by a barrier layer of Ti/TiN or Co/TiN or Ta/TiN is formed not only filled within the source-body contact trench 212, the source electrode contact trench 216 and the gate electrode contact trench 215 but also overlying top surface of the N epitaxial layer 201 to contact with the n+ source regions 208, the P body regions 209, the source electrode 211 and the gate electrode 204', wherein the tungsten layer 217 is patterned into two portions: one connected to a source metal 218 padded by a resistance-reduction layer of Ti or Ti/TiN, and the other connected to a gate metal 219 padded by a resistance-reduction layer of Ti or TiN. What should be noticed is that, the gate electrode 204 in each the gate trench 203 is connected to the gate electrode 204' to be connected to the gate metal 219 through a built in gate electrode spreading resistance Rg (as illustrated in FIG. 2) through the gate electrode contact area, while the shielded electrode 205 in each the gate trench 203 is connected to the source electrode 211 to be connected to the source metal 218 through a built in shielded electrode spreading resistance Rs (as illustrated in FIG. 2) through the shielded electrode contact area, wherein the gate electrode spreading resistance is lower than the shielded electrode spreading resistance.

Figure 3:
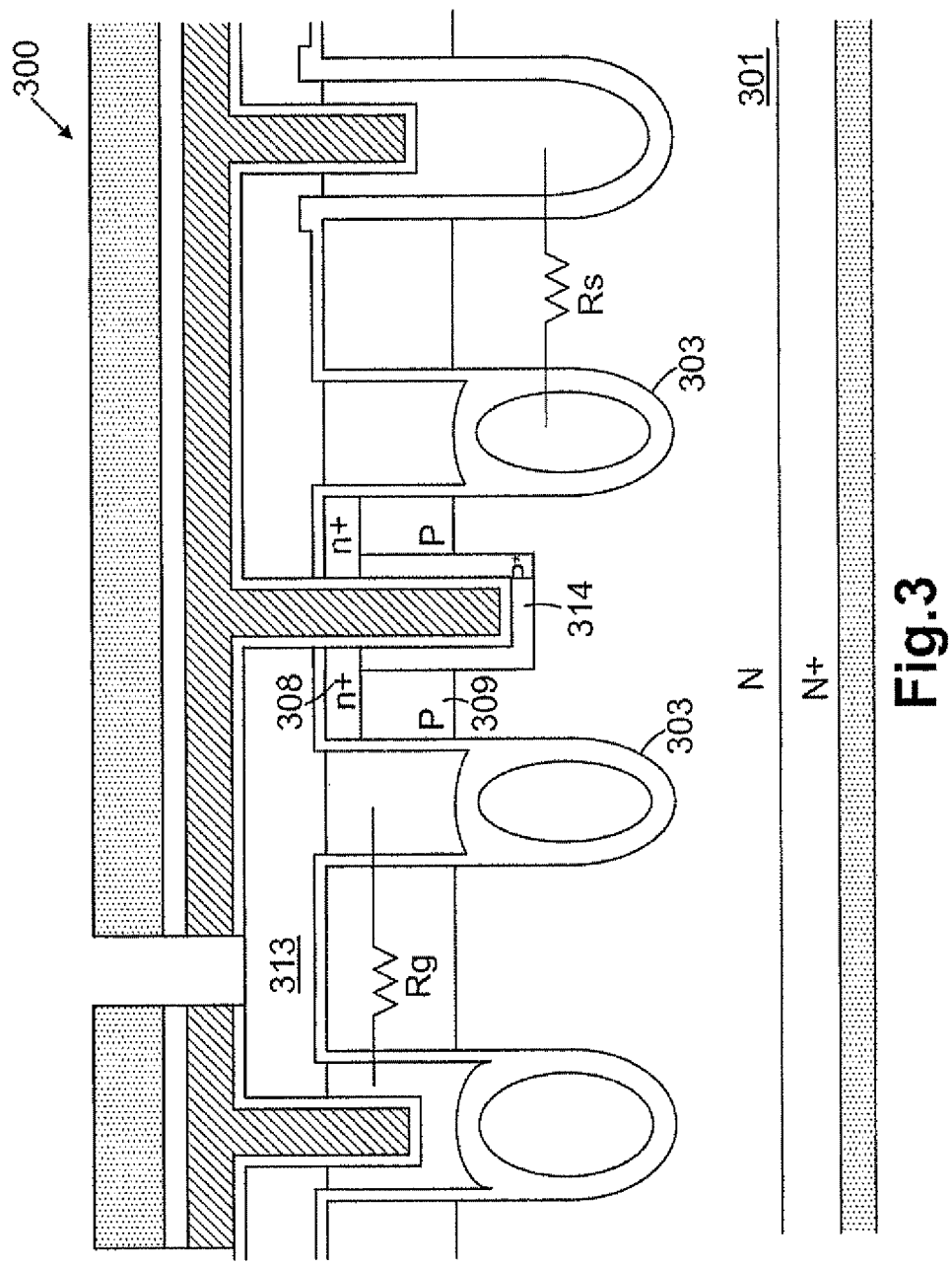
FIG. 3 is a cross-sectional view showing another preferred embodiment of the present invention.

FIG. 3 is a cross-sectional view showing a shielded gate trench MOSFET 300 according to another preferred embodiment of the present invention which has a similar configuration to the shielded gate trench MOSFET 200 in FIG. 2 except that, the source-body contact trench 312 is penetrating through the contact insulating layer 313, the n+ source regions 318 and the P body regions 319 and extending into the N epitaxial layer 301, and the P* anti-punch through region 314 is formed surrounding bottom and sidewalls of the source-body contact trench 312 below the n+ source regions 308, therefore, the P body regions 309 in the active area is located between the P* anti-punch through doped region 314 and the adjacent gate trench 303.

Figure 4:
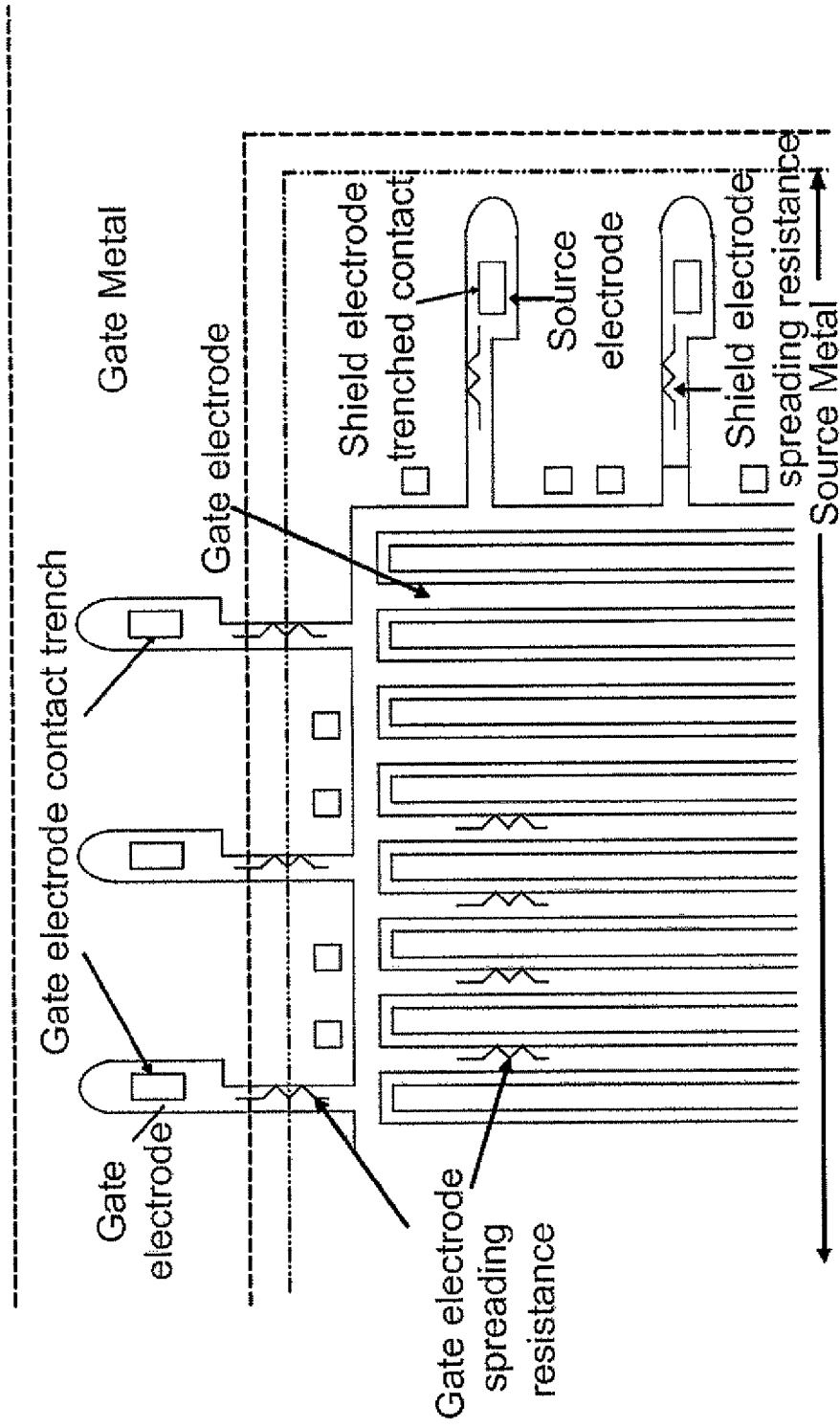
FIG. 4 is a top view showing the shielded gate trench MOSFET according to the present invention.

FIG. 4 is a top view of the present invention showing that each the shielded electrode (underneath each the gate electrode, not shown) is connected to the source electrode through the shielded electrode spreading resistance, wherein the source electrode is connected to the source metal through the tungsten layer (not shown) filled into the source electrode contact trench. It can be also seen that, each the gate electrode is connected to the gate electrode in the wider gate trench through the gate electrode spreading resistance, wherein the gate electrode in the wider gate trench is connected to the gate metal through the tungsten layer (not shown) filled into the gate electrode contact trench.

Figure 5:
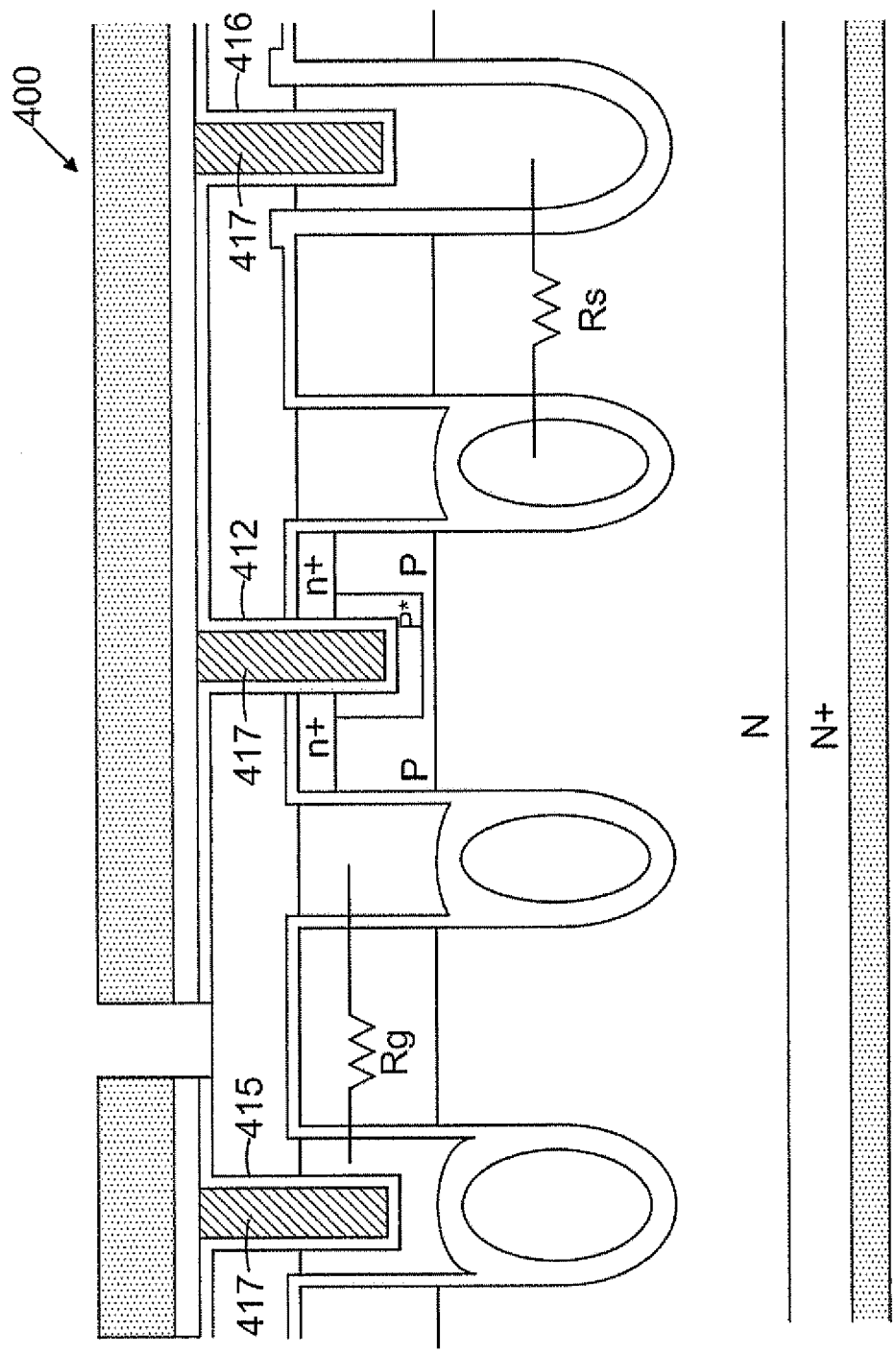
FIG. 5 is a cross-sectional view showing another preferred embodiment of the present invention.

FIG. 5 is a cross-sectional view showing a shielded gate trench MOSFET 400 according to another preferred embodiment of the present invention which has a similar configuration to the shielded gate trench MOSFET, 200 in FIG. 2 except that, the tungsten layer 417 is etched back to be kept only within each the source-body contact trench 412, the source electrode contact trench 416 and the gate electrode contact trench 415.

Figure 6A:
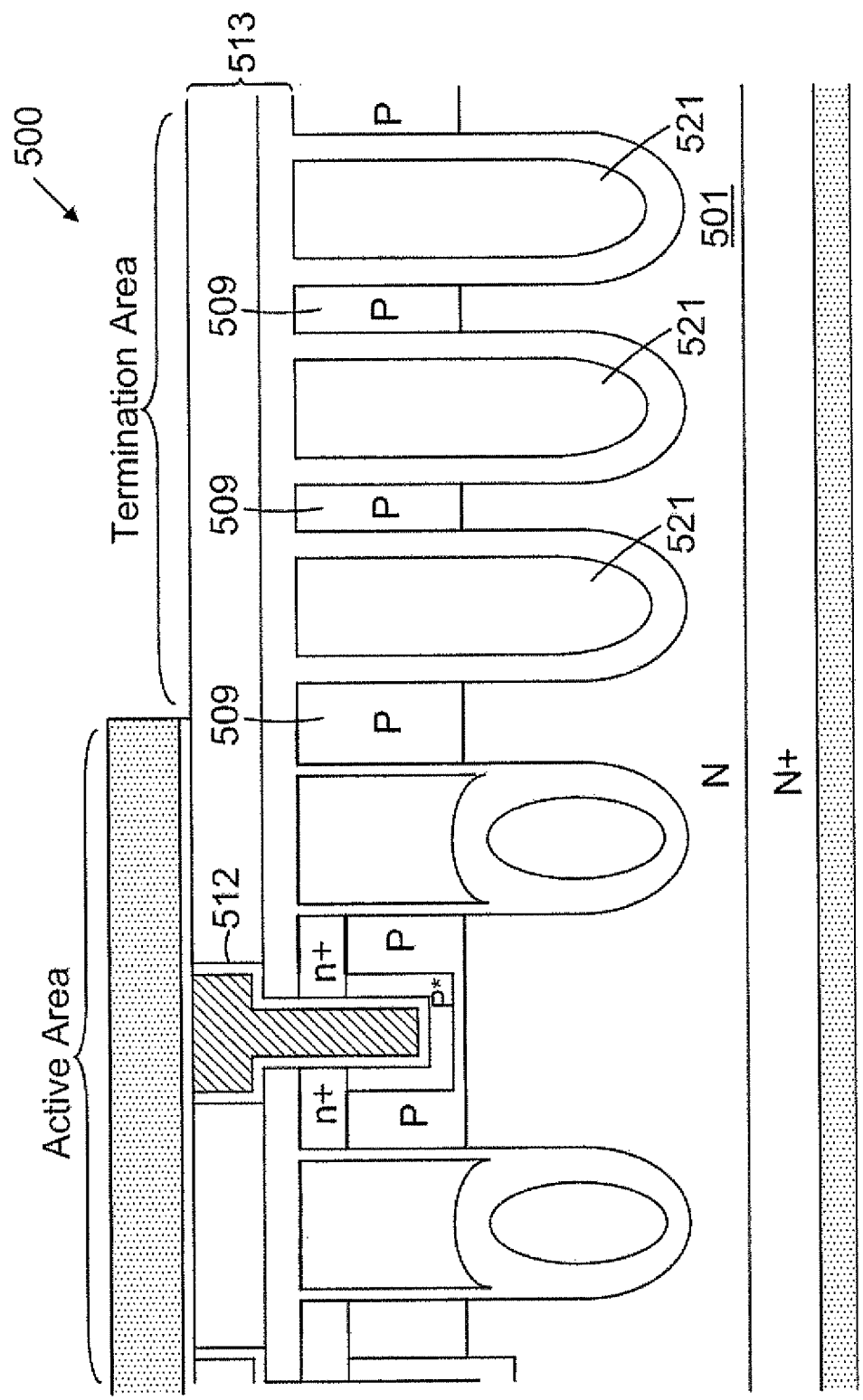
FIG. 6A is a cross-sectional view showing another preferred embodiment of the present invention.

FIG. 6A is a cross-sectional view showing a shielded gate trench MOSFET 500 according to another preferred embodiment of the present invention which has a similar configuration to the shielded gate trench MOSFET 200 in FIG. 2 except that, the shielded gate trench MOSFET 500 further comprises a termination area including multiple of trenched gates 521 having floating voltage, and the P body regions 509 are extended to the termination area in upper portion of the N epitaxial layer 501 between two adjacent of the trenched gates 521. Besides, the contact insulating layer 513 comprises a BPSG layer and an NSG layer beneath, and the source-body contact trench 512 has greater trench width in the BPSG layer than in the NSG layer. There is no source region in the termination area.

Figure 6B:
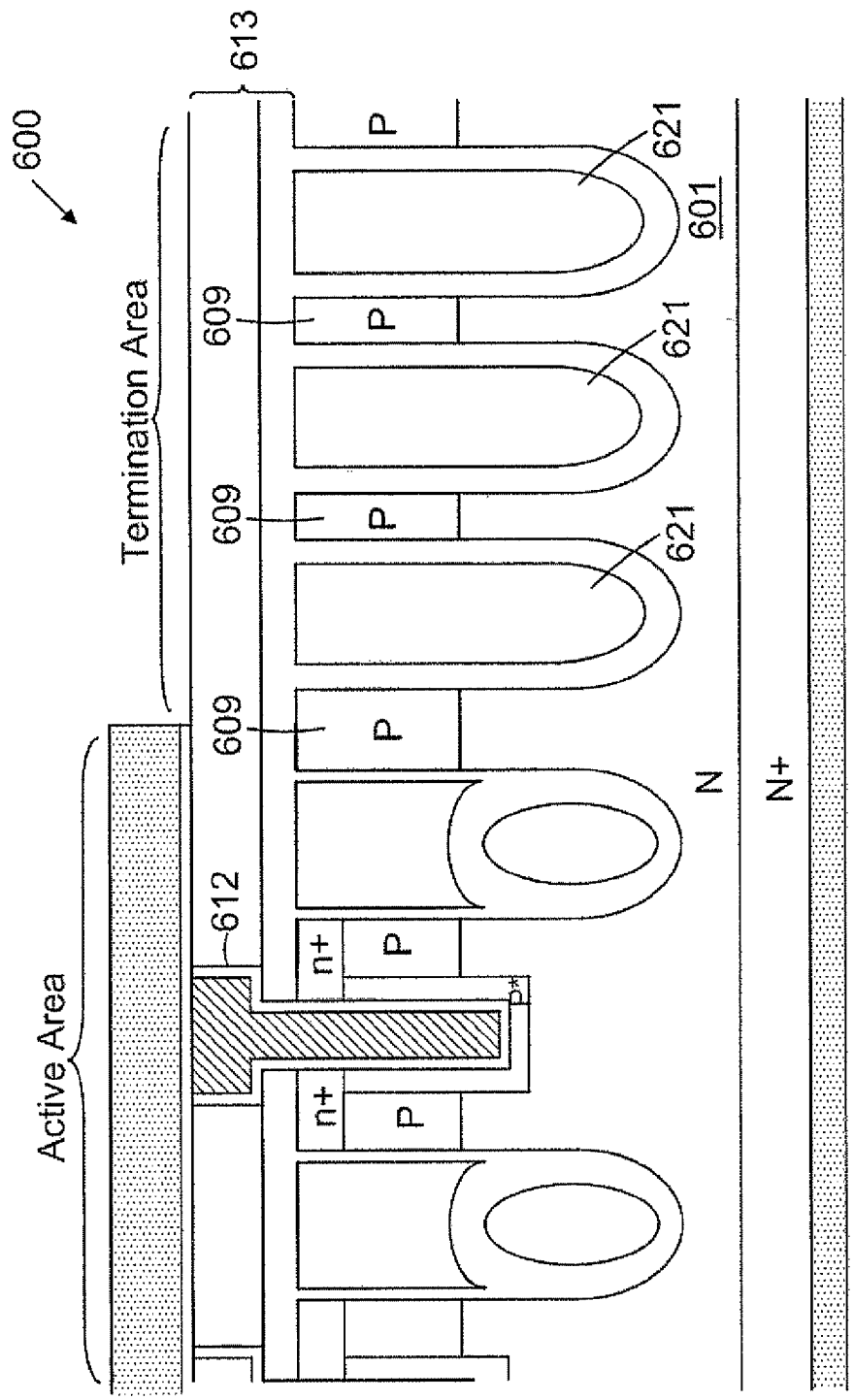
FIG. 6B is a cross-sectional view showing another preferred embodiment of the present invention.

FIG. 6B is a cross-sectional view showing a shielded gate trench MOSFET 600 according to another preferred embodiment of the present invention which has a similar configuration to the shielded gate trench MOSFET 300 in FIG. 3 except that, the shielded gate trench MOSFET 600 further comprises a termination area including multiple of trenched gates 621 having floating voltage, and the P body regions 609 are extended to the termination area in upper portion of the N epitaxial layer 601 between two adjacent of the trenched gates 621. Besides, the contact insulating layer 613 comprises a BPSG layer and an NSG layer beneath, and the source-body contact trench 612 has greater trench width in the BPSG layer than in the NSG layer.

Figure 6C:
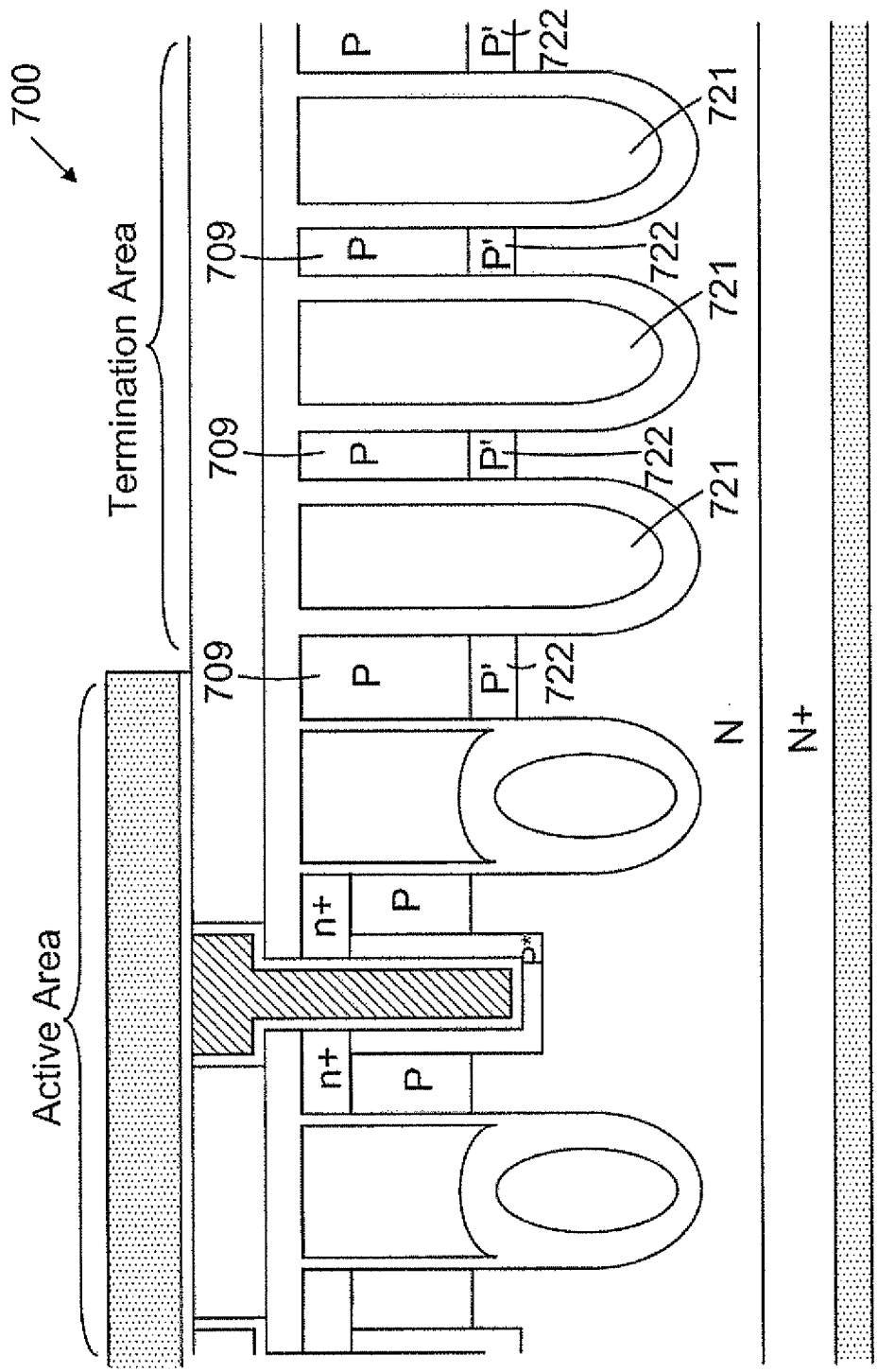
FIG. 6C is a cross-sectional view showing another preferred embodiment of the present invention.

FIG. 6C is a cross-sectional view showing a shielded gate trench MOSFET 700 according to another preferred embodiment of the present invention which has a similar configuration to the shielded gate trench MOSFET 600 in FIG. 6B except that, the termination area of the shielded gate trench MOSFET 700 further comprises a P' breakdown enhancement doped region 722 below each the P body region 709 and above bottom and each the trenched gate 721 which has floating voltage to further enhance the breakdown voltage.

Figure 6D:
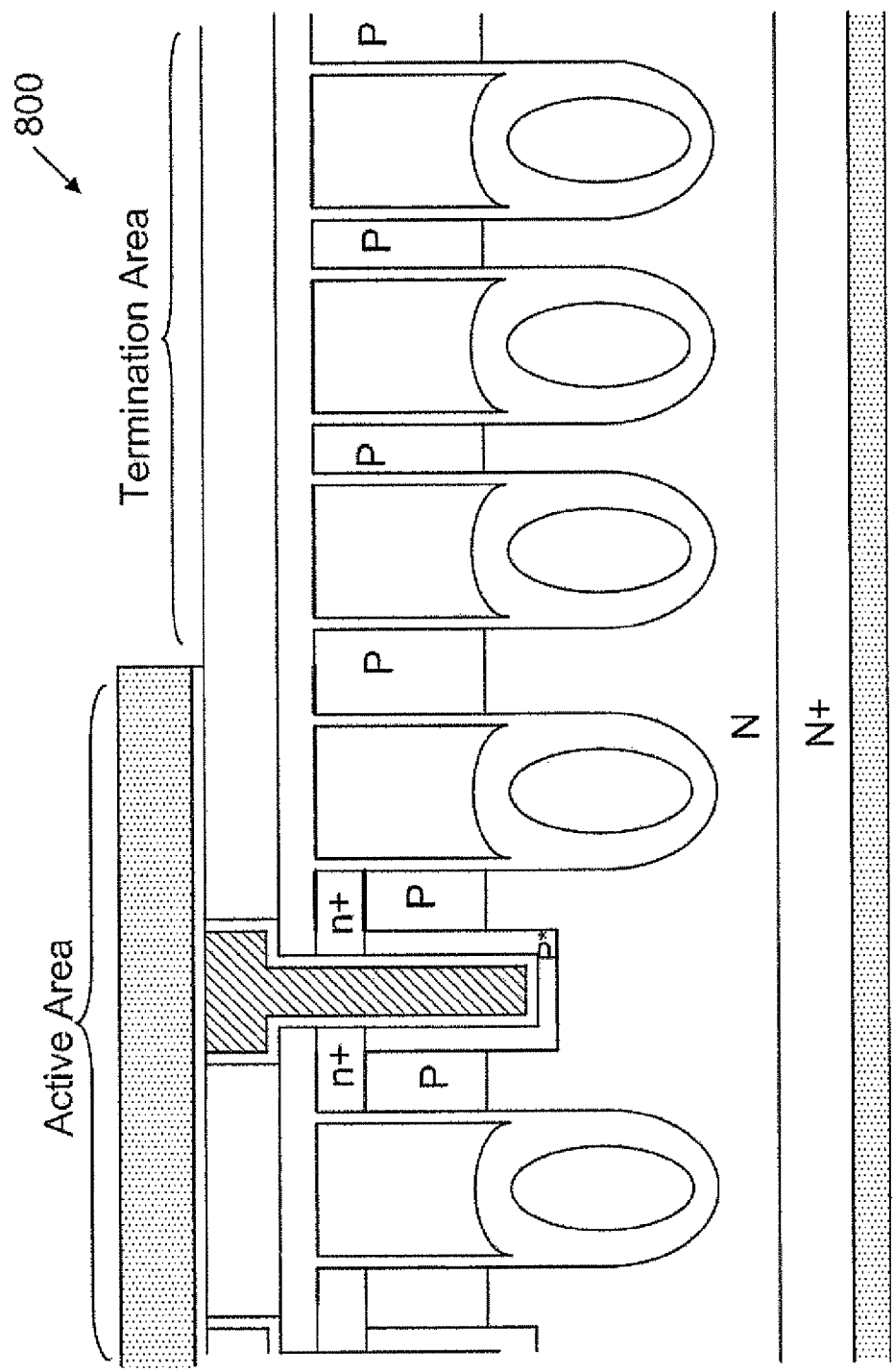
FIG. 6D is a cross-sectional view showing another preferred embodiment of the present invention.

FIG. 6D is a cross-sectional view showing a shielded gate trench MOSFET 800 according to another preferred embodiment of the present invention which has a similar configuration to the shielded gate trench MOSFET 600 in FIG. 6B except that, each the trenched gate in the termination area comprises a gate electrode in upper portion and a shielded electrode in lower portion, which has the same structure as the gate trench in the active area.

Figure 6E:
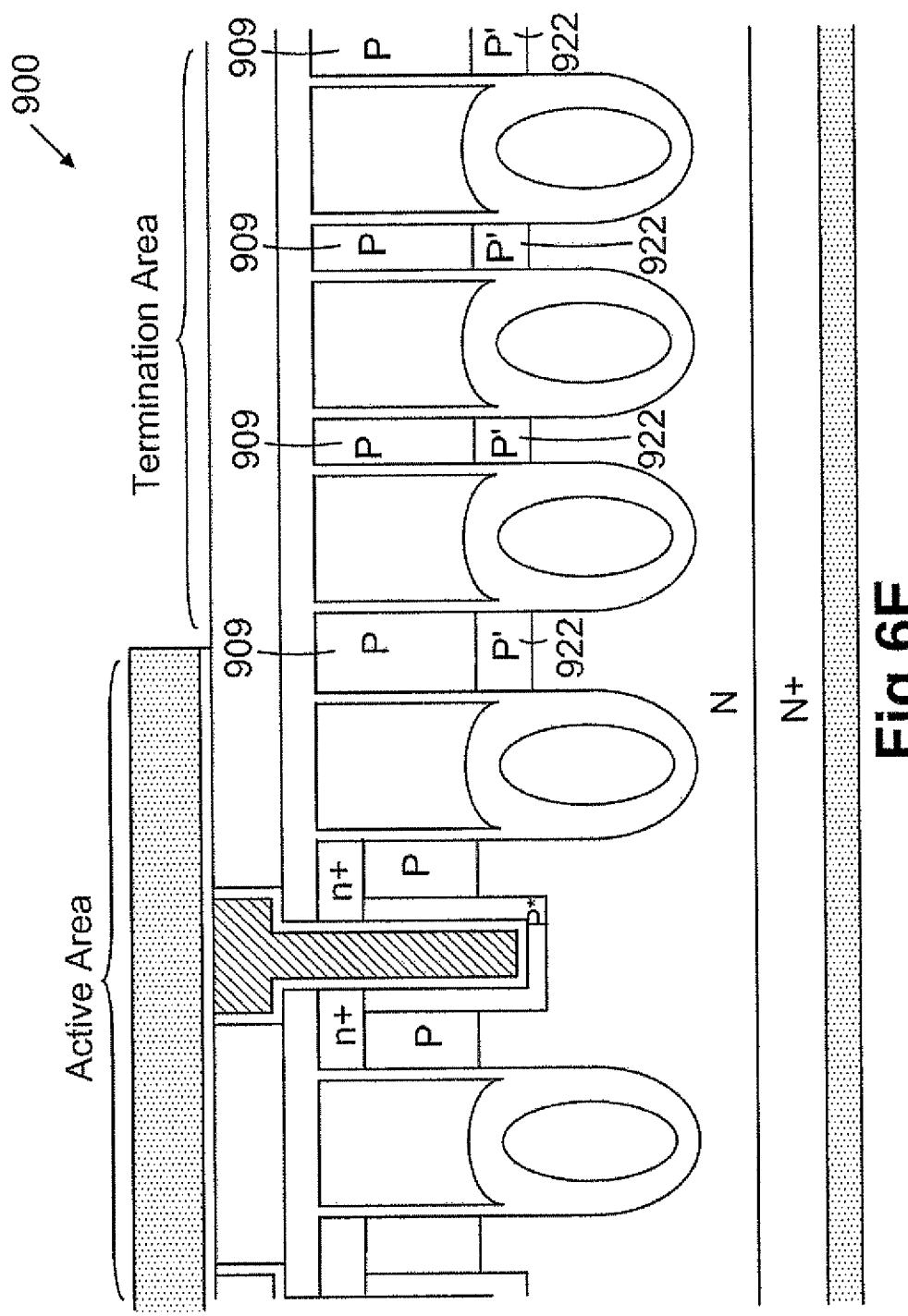
FIG. 6E is a cross-sectional view showing another preferred embodiment of the present invention.

FIG. 6E is a cross-sectional view showing a shielded gate trench MOSFET 900 according to another preferred embodiment of the present invention which has a similar configuration to the shielded gate trench MOSFET 800 in FIG. 6D except that, the termination area of the shielded gate trench MOSFET 900 further comprises a P' breakdown enhancement doped region 922 below each the P body region 909 and above bottom and each the trenched gate which has floating voltage to further enhance the breakdown voltage.

Figure 7A:
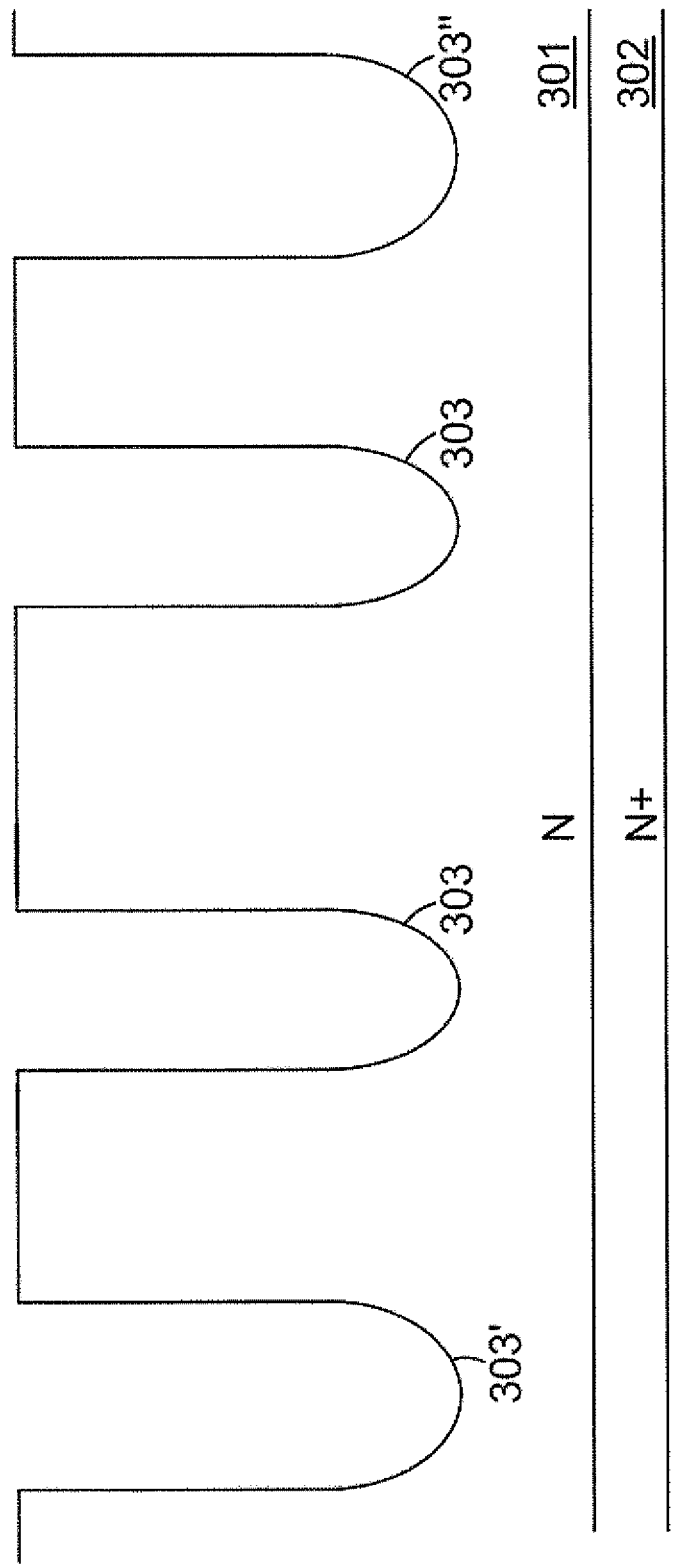
FIGS. 7A~7F are a serial of cross-sectional views for showing the processing steps for fabricating the shielded gate trench MOSFET as shown in FIG. 3.

FIGS. 7A to 7F are a serial of exemplary steps that are performed to form the preferred shielded gate trench MOSFET 300 in FIG. 3. In FIG. 7A, an N epitaxial layer 301 is grown on an N+ substrate 302. A trench mask (not shown) is applied to open a plurality of gate trenches extending from top surface of the N epitaxial layer 301, among those gate trenches including: a plurality of gate trenches 303 in the active area; at least one gate trench 303' in gate electrode contact area and at least one gate trench 303" in shielded electrode contact area.

Figure 7B:
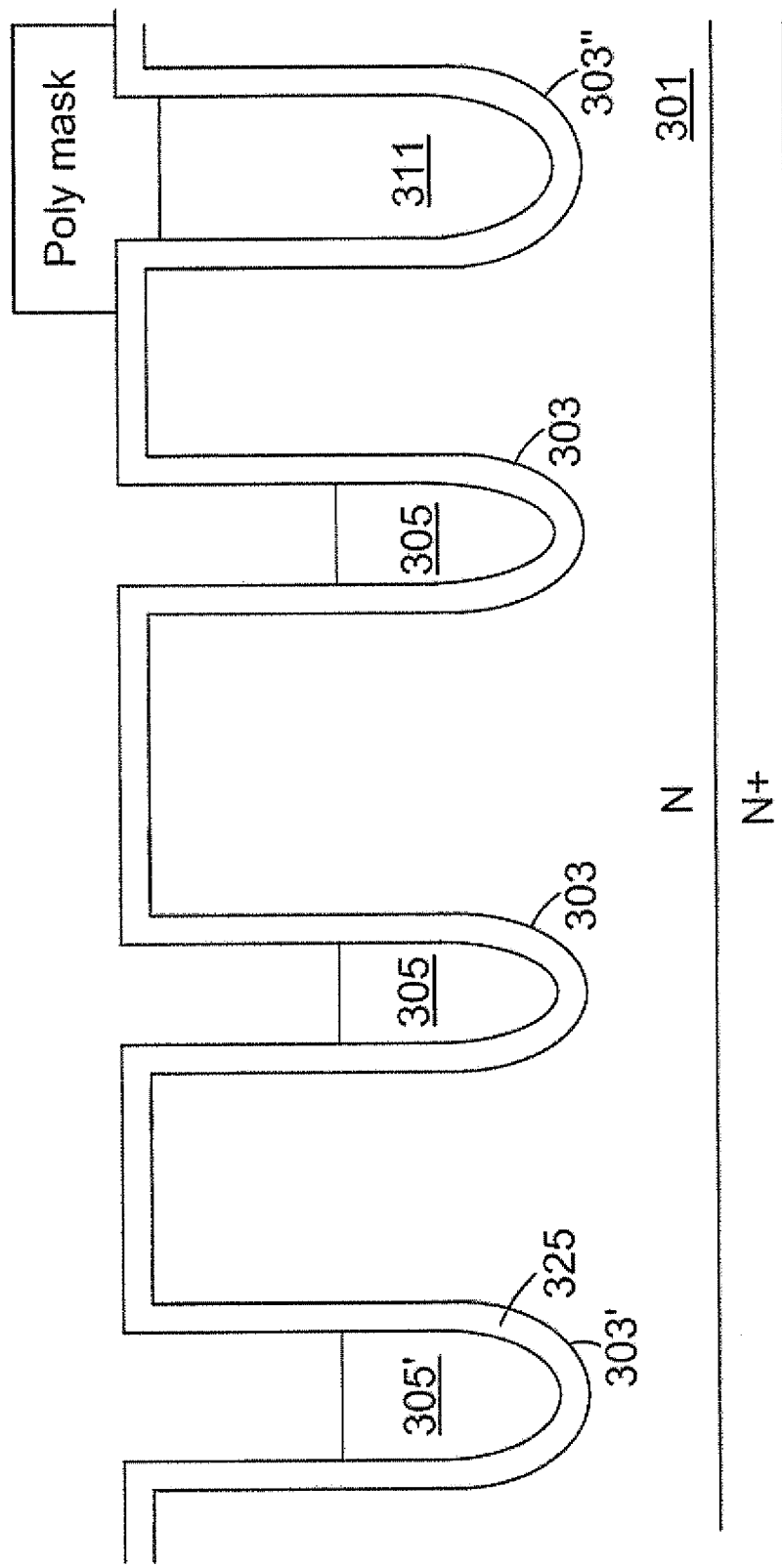

In FIG. 7B, a sacrificial oxide layer 325 is grown along inner surface of those gate trenches formed in FIG. 7A and overlying the top surface of the N epitaxial layer 301. Then, a first doped poly-silicon layer is first deposited filling in those gate trenches and covering the top surface of the N epitaxial layer 301 and then processed by poly-silicon CMP (Chemical Mechanical Polishing). After that, a poly mask is applied onto the first doped poly-silicon layer and a step of dry poly-silicon etching back is performed to remove portion of the first doped poly-silicon layer away from the upper portion of the gate trenches 303 in the active area and the gate trench 303' in the gate electrode contact area to form shielded electrode 305 and 305' respectively in the gate trenches 303 and 303'. Therefore, the doped poly-silicon layer in the gate trench 303" is fully remained to act as the source electrode 311.

Figure 7C:
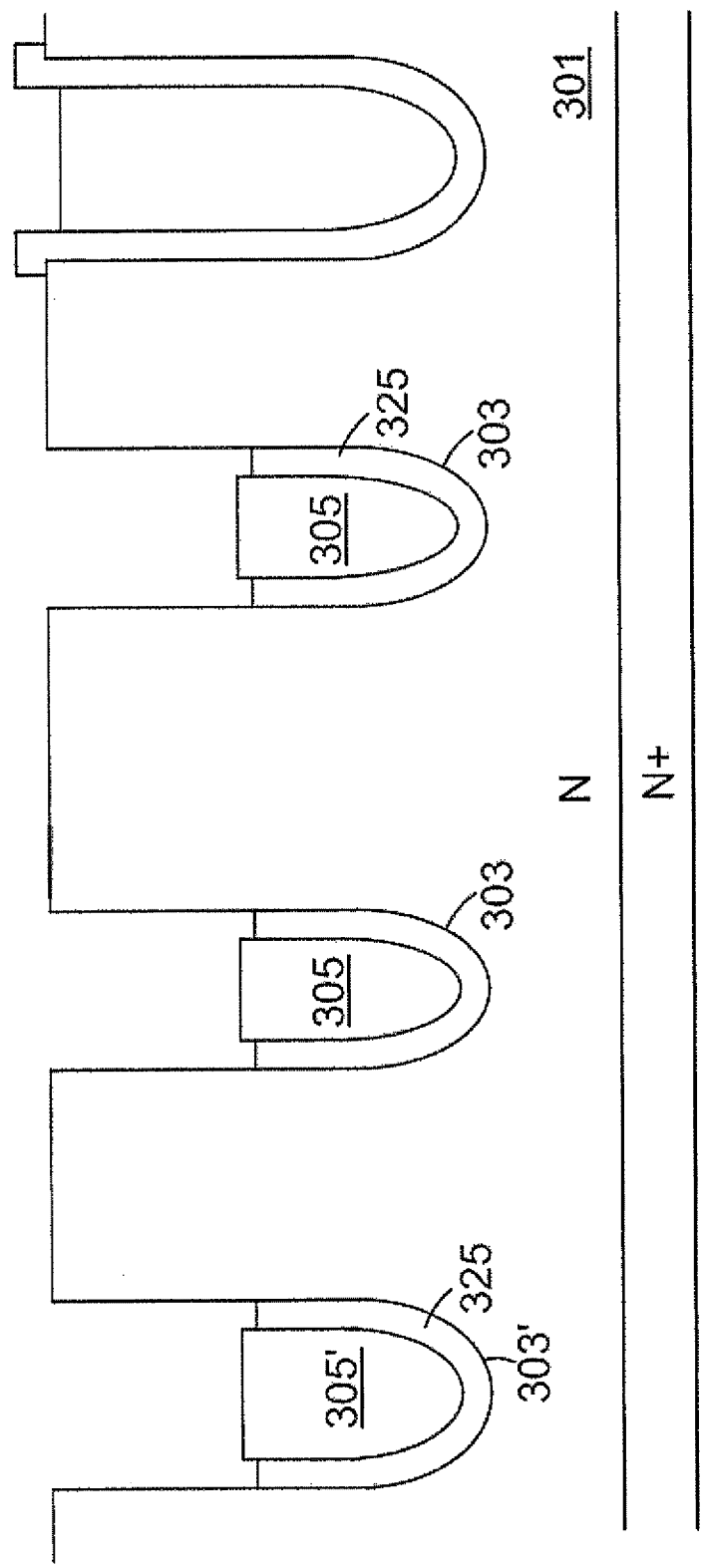

In FIG. 7C, a step of the sacrificial oxide time etching back is performed to remove the sacrificial oxide 325 away from upper sidewalls of the gate trenches 303 and 303' and the top surface of the N epitaxial layer 301 not covered by the poly mask as illustrated in FIG. 2, making top surface of the sacrificial oxide 325 lower than top surface of the shielded electrode 305 and 305' in gate trenches 303 and 303', respectively to act as a second gate oxide layer surrounding lower sidewalls of bottoms of the gate trenches 303 and 303', while surrounding sidewall and bottom of the gate trench 303". And then, the poly mask as illustrated in FIG. 7B is removed away.

Figure 7D:
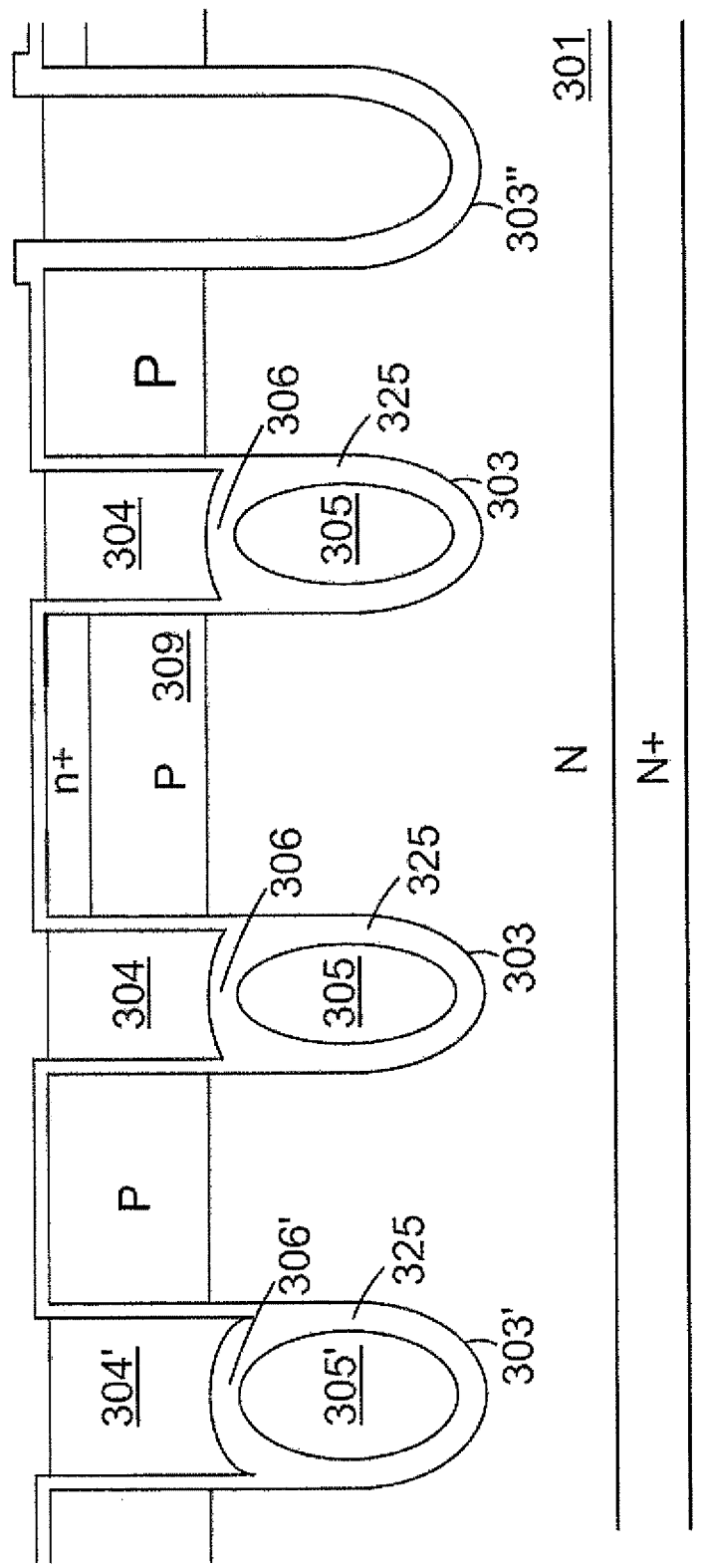

In FIG. 7D, a gate oxidation is carried out to form gate oxide layer covering the top surface of the sacrificial oxide 325 and the shielded electrodes 305 and 305' to serve as the inter-electrode insulating layer 306 and 306', as well as along upper sidewalls of the gate trenches 303 and 303' and overlying the top surface of the N epitaxial layer 301 to act as the first gate oxide 307. Then, a second doped poly-silicon layer is deposited onto the inter-electrode insulating layer 306 and 306' and the first gate oxide 307. After that, the second doped poly-silicon layer is processed by CMP and doped poly etching back to form the gate trench 304 and 304' filling within the upper portion of the gate trench 303 and 303', respectively. Next, a P body ion implantation and a driving in step are successively carried out to form the P body region 309 extending in upper portion of the N epitaxial layer 301 between every two adjacent of the gate trenches 303, 303' and 303". Then, after applying a source mask (not shown), an n+ source ion implantation is carried out optionally followed by a driving in step to form the n+ source region 308 only disposed in upper portion of the P body region 309 in the active area.

Figure 7E:
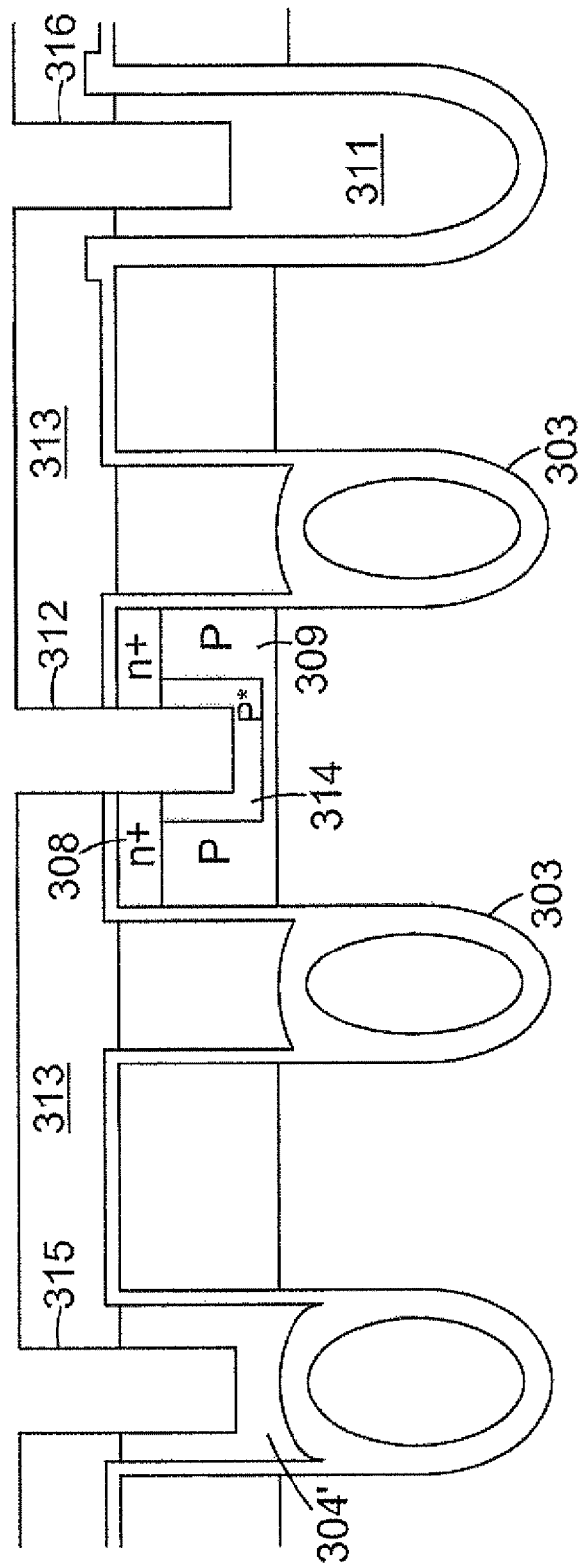

In FIG. 7E, an oxide is deposited onto top surface of the shielded gate trench MOSFET to serve as the contact insulating layer 313. Then, after applying a contact mask (not shown), a step of dry contact oxide etching and a step of dry silicon etching are successively carried out to form a plurality of contact trenches, including: a source-body contact trench 312 penetrating through the contact insulating layer 313, the n+ source region 308 and extending into the P body region 309 between every two adjacent of the gate trench 303 in the active area; a gate electrode contact trench 315 penetrating through the contact insulating layer 313 and extending into the gate electrode 304' in the gate electrode contact area; a source electrode contact trench 316 penetrating through the contact insulating layer 313 and extending into the source electrode 311 in the shielded electrode contact area. Next, a BF2 zero degree ion implantation and a BF2 angle ion implantation are successively carried out and followed by a RTA (rapid thermal annealing) process to form the anti-punch through region 314 in the P body region 309 and surrounding bottom and sidewalls of the source-body contact trench 312 below the n+ source regions 308.

Figure 7F:
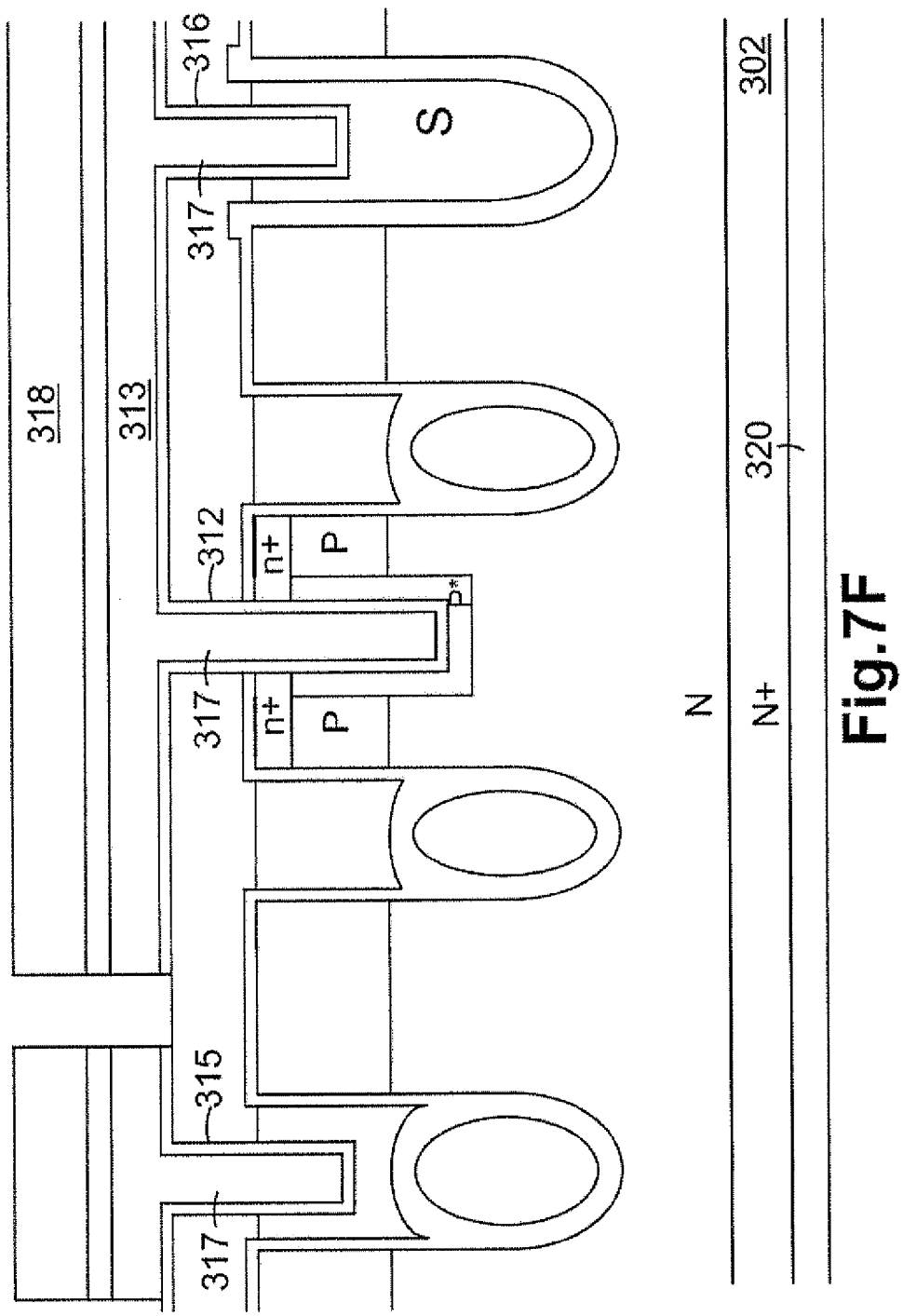

In FIG. 7F, after depositing a barrier layer of Ti/TiN or Co/TiN or Ta/TiN covering top surface of the contact insulating layer 313 and along inner surface of the source-body contact trench 312, the gate electrode contact trench 315 and the source electrode contact trench 316, a tungsten layer 317 is deposited onto the barrier layer and then optionally etched back to keep the tungsten layer 317 remaining only in those contact trenches. Then, onto the barrier layer and the tungsten layer 317, a front metal Al alloys 318 padded by a resistance-reduction layer Ti or Ti/TiN is deposited and then be patterned by a metal mask (not shown) and metal etching process. Next, after grinding the backside of the N+ substrate 302, a back metal 320 is deposited whereon as drain metal.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A power semiconductor device comprising:
    a plurality of gate trenches extending into a silicon layer of a first conductivity type;
    a gate electrode disposed in upper portion of each of said gate trenches and a shielded electrode disposed in lower portion of each of said gate trenches, wherein said gate electrode and said shielded electrode insulated from each other by an inter-electrode insulating layer;
    said gate electrode and said shielded electrode are doped poly-silicon layers wherein said gate electrode having doping concentration equal to or higher than said shielded electrode;
    said gate electrode connected to a gate metal through a gate electrode spreading resistance and said shielded electrode connected to a source metal through a shielded electrode spreading resistance; and
    said upper portion of said gate trenches surrounded by source regions of said first conductivity type and body regions of a second conductivity type in active area.

2. The power semiconductor device of claim 1, wherein said gate electrode spreading resistance is less than said shielded electrode spreading resistance.

3. The power semiconductor device of claim 1 further comprising a first gate oxide along sidewalls of said gate electrode and a second gate oxide surrounding bottom and sidewalls of said shielded electrode in each of said gate trenches, wherein said second gate oxide having oxide thickness thicker than said first gate oxide.

4. The power semiconductor device of claim 1 further comprising a plurality of source-body contact trenches formed between two adjacent of said gate trenches and penetrating through a contact insulating layer and said source regions and extending into said body regions.

5. The power semiconductor device of claim 1, wherein said contact insulating layer is a single oxide layer.

6. The power semiconductor device of claim 1, wherein said contact insulating comprises a BPSG layer and an NSG layer beneath, wherein said source-body contact trenches have greater trench width in said BPSG layer than in the NSG layer.

7. The power semiconductor device of claim 1 further comprising a plurality of source-body contact trenches formed between two adjacent of said gate trenches and penetrating through a contact insulating layer, said source regions and said body regions and extending into said silicon layer.

8. The power semiconductor device of claim 1 further comprising a tungsten layer padded by a barrier layer filled into each said source-body contact trench for contacting said source regions and said body regions along sidewalls of said source-body contact trenches, and said tungsten layer electrically connected to said source metal.

9. The power semiconductor device of claim 1 further comprising a tungsten layer padded by a barrier layer filled into each said source-body contact trench for contacting said source regions and said body regions along sidewalls of said source-body contact trenches, and said tungsten layer electrically connected to said source metal.

10. The power semiconductor device of claim 1 further comprising an anti-punch through region of said second conductivity type surrounding sidewall and bottom of each said source-body contact trench below said source region.

11. The power semiconductor device of claim 1 further comprising an anti-punch through region of said second conductivity type surrounding sidewall and bottom of each said source-body contact trench below said source region.

12. The power semiconductor device of claim 1, wherein said tungsten layer is only filled within each said source-body contact trench but not extended over top surface of said contact insulating layer.

13. The power semiconductor device of claim 1, wherein said tungsten layer is not only filled within each said source-body contact trench but also extended over top surface of said contact insulating layer.

14. The power semiconductor device of claim 1, wherein said tungsten layer is only filled within each said source-body contact trench but not extended over top surface of said contact insulating layer.

15. The power semiconductor device of claim 1, wherein said tungsten layer is not only filled within each said source-body contact trench but also extended over top surface of said contact insulating layer.

16. The power semiconductor device of claim 1, wherein said gate electrodes extended to a gate electrode contact area in which said gate trenches having a greater trench width than those in said active area as wider gate electrode for electrically connecting to said gate metal, and said source regions not disposed in said gate electrode contact area, and said gate electrode spreading resistance built in between each said gate electrode and said gate metal through said gate electrode contact area.

17. The power semiconductor device of claim 1, wherein said shielded electrodes extended to a shielded electrode contact area in which said gate trenches having a greater trench width than those in said active area as wider shielded electrodes for electrically connecting to said source metal, and said source regions not disposed in said shielded electrode contact area, and said shielded electrode spreading resistance built in between each said shielded electrode and said source metal through said source electrode contact area.

18. The power semiconductor device of claim 1 further comprising a termination area having multiple trenched floating gates with floating voltage, penetrating through said body region and extending into said silicon layer wherein said termination area does not have source regions.

19. The power semiconductor device of claim 1 further comprising a breakdown enhancement doped region of said second conductivity type below said body region and above bottom of each said trenched floating gate.

20. The power semiconductor device of claim 1, wherein each of said trenched floating gates comprising a single doped poly-silicon layer with doping concentration same as said shielded electrodes.

21. The power semiconductor device of claim 1, wherein each of said trenched floating gates comprising an upper and a lower doped poly-silicon layers insulated from each other by an inter-electrode insulating layer.

* * * * *